United States Patent [19]
Clarke et al.

[11] Patent Number: 5,612,547
[45] Date of Patent: Mar. 18, 1997

[54] SILICON CARBIDE STATIC INDUCTION TRANSISTOR

[75] Inventors: Rowland C. Clarke, Bell Twp., Westmoreland County; Richard R. Siergiej, Irwin; Saptharishi Sriram, Monroeville, all of Pa.

[73] Assignee: Northrop Grumman Corporation, Los Angeles, Calif.

[21] Appl. No.: 462,405

[22] Filed: Jun. 5, 1995

Related U.S. Application Data

[63] Continuation of Ser. No. 139,472, Oct. 18, 1993, abandoned.

[51] Int. Cl.$^6$ ............... H01L 31/0312; H01L 29/80; H01L 31/112; H01L 27/095
[52] U.S. Cl. ............... 257/77; 257/264; 257/266; 257/267; 257/268; 257/473; 257/471
[58] Field of Search ............... 257/77, 256, 263, 257/264, 265, 266, 267, 268, 269, 279, 280, 284, 288, 114; 437/100

[56] References Cited

U.S. PATENT DOCUMENTS

| | | | |
|---|---|---|---|
| 2,854,364 | 9/1958 | Lely | 437/100 |
| 3,767,984 | 10/1973 | Shinoda et al. | 257/280 |
| 4,317,127 | 2/1982 | Nishizawa | 257/265 |
| 4,326,209 | 4/1982 | Nishizawa et al. | 257/264 |
| 4,375,124 | 3/1983 | Cogan | 257/264 |
| 4,400,710 | 8/1983 | Nishizawa et al. | 257/280 |
| 4,470,059 | 9/1984 | Nishizawa et al. | 257/264 |
| 4,476,622 | 10/1984 | Cogan | 257/264 |
| 4,484,207 | 11/1984 | Nishizawa et al. | 257/264 |
| 4,497,107 | 5/1985 | Cogan | 257/264 |
| 4,543,706 | 10/1985 | Bencuya et al. | 29/571 |
| 4,566,172 | 1/1986 | Bencuya et al. | 29/571 |
| 4,638,342 | 1/1987 | Freeouf et al. | 257/256 |
| 4,673,985 | 6/1987 | Nishizawa | 257/257 |
| 4,713,358 | 12/1987 | Bulat et al. | 437/65 |
| 4,762,806 | 8/1988 | Suzuki et al. | 437/100 |
| 4,811,064 | 3/1989 | Nisizawa et al. | 257/265 |
| 4,829,349 | 5/1989 | Luryi | 257/288 |
| 5,032,538 | 7/1991 | Bozier et al. | 437/83 |
| 5,118,639 | 6/1992 | Roth et al. | 437/41 |
| 5,202,273 | 4/1993 | Nakamura | 437/40 |
| 5,406,096 | 4/1995 | Malhi | 257/114 |

OTHER PUBLICATIONS

J. Appl. Phys. 61(3), Feb. 1, 1987, "Raman scattering of SiC: Application to the identification of heteroepitaxy of SiC polytypes" by Okumura et al., P,1134–P,1136.

"The Potential of Diamond and SiC Electronic Devices for Microwave and Millimeter-Wave Power Applications" by R. Trew, J.B. Yan, P. Mock, Proceedings of the IEEE, vol. 79, No. 5, May 1991.

"Thin Film Deposition and Microelectric and Optoelectronic Device Fabrication and Characterization in Monocrystalline Alpha and Beta Silicon Carbide" by R. Davis, G. Kelner, M. Shur, J. Palmour, J. Edmond, Proceedings of the IEEE, vol. 79, No. 5, May 1991.

*Primary Examiner*—Steven H. Loke
*Attorney, Agent, or Firm*—Philip A. Florenzo

[57] ABSTRACT

A static induction transistor fabricated of silicon carbide, preferably 6H polytype, although any silicon carbide polytype may be used. The preferred static induction transistor is the recessed Schottky barrier gate type. Thus, a silicon carbide substrate is provided. Then, a silicon carbide drift layer is provided upon the substrate, wherein the drift layer has two spaced-apart protrusions or fingers which extend away from the substrate. Each protrusion of the drift layer has a source region of silicon carbide provided thereon. A gate material is then provided along the drift layer between the two protrusions. A conductive gate contact is provided upon the gate material and a conductive source contact is provided upon each source region. A conductive drain contact is provided along the substrate. Other gate types for the static induction transistor are contemplated. For example, a planar Schottky barrier gate may be employed. Furthermore, recessed or planar MOS gates may be utilized, as may a PN junction gate.

8 Claims, 2 Drawing Sheets

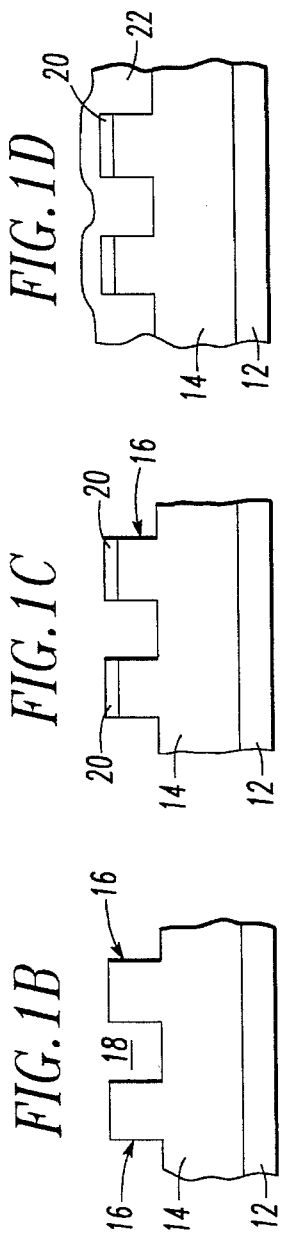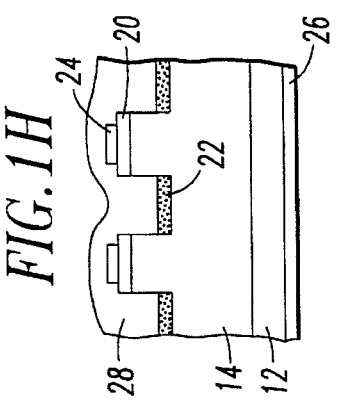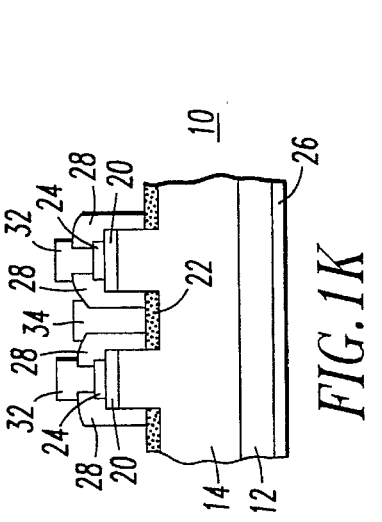

5,612,547

SILICON CARBIDE STATIC INDUCTION TRANSISTOR

This application is a continuation, of application Ser. No. 08/139,472 filed Oct. 18, 1993 now abandoned.

BACKGROUND OF THE INVENTION

1. Field of the Invention

This invention relates generally to gate-source structures for static induction transistors and more particularly to static induction transistors fabricated of silicon carbide.

2. Description of the Prior Art

Static induction transistors are field effect semiconductor devices capable of operation at relatively high frequency and power. The transistors are characterized by short, high resistivity semiconductor channel which may be controllably depleted of carriers. Static induction transistors generally use vertical geometry with source and drain electrodes placed on opposite sides of a thin, high resistivity layer of one conductivity type. Gate regions of opposite conductivity type are positioned in the high resistivity layer on opposite sides of the source electrode. During operation, a reverse bias is applied between the gate region and the remainder of the high resistivity layer causing a depletion region to extend into the channel below the source. As the magnitude of the reverse bias is varied, the source drain current and voltage derived from an attached energy source will also vary. Such devices are described in U.S. Pat. No. 4,713,358 to Bulat et al.

Silicon carbide is a wide energy band gap semiconductor (approximately 3 eV), and is thus an attractive material for the fabrication of integrated-power circuitry. Silicon carbide offers high saturation electron velocity (approximately $2 \times 10^7$ cm/s), high junction breakdown voltage (approximately $2 \times 10^7$ V/cm), high thermal conductivity (approximately 5 W/cm °C.) and broad operating temperature range (around 1100° C.). In addition, the energy band gap and thus the maximum operating temperature range of silicon carbide is at least twice that of conventional semiconductors.

Diffused junctions are not practical at the present time in silicon carbide based devices. Therefore, instead of the diffused p/n junction that has been used in silicon static induction transistors, other techniques must be developed to fabricate the gates in silicon carbide devices.

SUMMARY OF THE INVENTION

We provide a static induction transistor fabricated of silicon carbide. It is known to those skilled in the art that silicon carbide may be crystallized in a great many polytypes, and although the present static induction transistor is preferably formed of 6H polytype, it is understood that the static induction transistor may be formed of any silicon carbide polytype such as 3 C, 2H, 4H and 15 R.

The first preferred static induction transistor is the recessed Schottky barrier gate type. Thus, the transistor preferably is structured as follows. A silicon carbide substrate is provided. Then, a silicon carbide drift layer is provided upon the substrate, wherein the drift layer has two spaced-apart protrusions or fingers which extend away from the substrate. Each protrusion of the drift layer has a source region of silicon carbide provided thereon. A gate material is then provided along the drift layer between the two protrusions. A conductive gate contact is provided upon the gate material and a conductive source contact is provided upon each source region. A conductive drain contact is provided along the substrate.

The substrate is preferably n+ conductivity type while the drift layer is preferably n– conductivity type and the source regions are preferably n+ conductivity type. However, in an alternative embodiment, the substrate may be p+ conductivity type while the drift layer is p– conductivity type and the source regions are p+ conductivity type.

The drift layer and each source region are preferably formed by epitaxial growth, however, either or both of the layer and the regions may alternatively be formed by ion implantation. The gate material is preferably platinum silicide although any suitable material may be used such as platinum, gold, molybdenum and polysilicon.

The presently disclosed silicon carbide static induction transistors offer improved performance over state of the art static induction transistors. Improved characteristics include (i) higher breakdown voltage due to higher field strength; (ii) lower thermal impedance due to better thermal conductivity; (iii) higher frequency performance due to higher saturated electron velocity; (iv) higher current due to higher field before velocity saturation; (v) higher operating temperature due to larger band gap; and (vi) improved reliability particularly in harsh environments.

Although the preferred static induction transistor is constructed having a recessed Schottky barrier gate, other embodiments of the static induction transistor are contemplated. For example, a planar Schottky barrier gate may be employed. Furthermore, recessed or planar MOS gates may be utilized, as may a PN junction gate.

Other objects and advantages of the invention will become apparent from a description of certain present preferred embodiments thereof shown in the drawings.

BRIEF DESCRIPTION OF THE DRAWINGS

FIG. 1A is a first step of the preferred method of forming the first preferred static induction transistor.

FIG. 1B is a second step of the preferred method of forming he first preferred static induction transistor.

FIG. 1C is a third step of the preferred method of forming the first preferred static induction transistor.

FIG. 1D is a fourth step of the preferred method of forming the first preferred static induction transistor.

FIG. 1E is a fifth step of the preferred method of forming the first preferred static induction transistor, FIG. 1F is a sixth step of the preferred method of forming the first preferred static induction transistor.

FIG. 1G is a seventh step of the preferred method of forming the first preferred static induction transistor, FIG. 1H is an eighth step of the preferred method of forming the first preferred static induction transistor.

FIG. 1I is a ninth step of the preferred method of forming the first preferred static induction transistor FIG. 1J is a tenth step of the preferred method of forming the first preferred static induction transistor.

FIG. 1K is an eleventh step of the preferred method of forming the first preferred static induction transistor.

DETAILED DESCRIPTION OF THE PREFERRED EMBODIMENT

Figure 2:
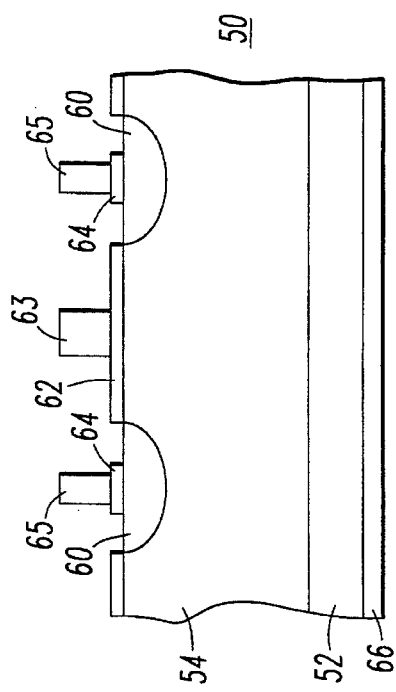
FIG. 2 is a cross-sectional view of a second preferred static induction transistor.

A static induction transistor fabricated of silicon carbide is described herein. The silicon carbide is preferably crystallized as a 6H polytype. However, it is understood that the static induction transistor may be formed of any silicon carbide polytype including 3 C, 2H, 4H and 15 R. The first preferred static induction transistor is the recessed Schottky barrier gate type. This design is preferred due to the Schottky barrier construction being compatible with high temperature performance.

With reference to FIGS. 1A through 1K a method for producing the first preferred static induction transistor 10 having Schottky barrier type gates is hereby described. Referring first to FIG. 1A, a substrate 12 of n+ silicon carbide is first provided. Then, a drift layer 14 of n− silicon carbide is epitaxially grown on the substrate 12. The preferred dopant introduced for the n type layers is nitrogen.

The designations of "+" and "−" used with the conductivity type are understood in the industry to indicate heavy and light doping, respectively. With reference to the present preferred embodiments of the invention, light doping (n− or p−) will generally indicate a range of roughly $10^{15}$–$10^{16}$ dopants/cm$^3$. Heavy doping (n+ or p+) will generally indicate $9\times10^{18}$ dopants/cm$^3$ or greater.

Reactive ion etching is then performed to remove portions of the drift layer 14 so as to leave a series of thick, spaced apart fingers 16 (only two of which are shown in the figures) extending outward from the substrate 12 such that a recess 18 is provided between adjacent fingers 16. The substrate 12 and etched drift layer 14 are shown in FIG. 1B. The reactive ion etching is done by standard means known in the industry, in which a masking material, such as chrome and nickel, is applied in a pattern to those areas in which it is desired that no material be removed. A reactive ion is then applied to the drift layer surface etching away the unmasked portions.

Referring next to FIG. 1C, source wells 20 are then provided upon the surface of the fingers 16 distal to the substrate 12. The source wells 20 are preferably n+conductivity type silicon carbide. The source wells 20 may be provided on the fingers 16 of the drift layer 14 by epitaxial growth, or alternatively, they may be provided by ion implantation. Alternatively, the source wells 20 may be provided upon the drift layer before the fingers 16 are reactive ion etched. In this case, the source wells are grown (or implanted) as a single layer. Then, when the fingers 16 are etched, each finger 16 will have a source layer or well thereupon.

A layer of gate material 22 is then deposited atop of the drift layer 14 as shown in FIG. 1D. The reactive ion etching process of the drift layer 14 often leaves the surface of the drift layer 14 at the recess 18 uneven. Thus, the gate material 22 may conformally coat the surface of the drift layer 14 in the recess 18 so as to smooth out and flatten that surface. The deposited gate material 22 is preferably platinum although other conductive materials such as molybdenum, gold, polysilicon and amorphous silicon may also be used.

Referring next to FIG. 1E, the deposited gate material 22 is then selectively removed, such as by reactive ion etching described above. Once the reactive ion etching has been performed, a layer of gate material 22 is provided upon the drift layer 14 within each recess 18, extending partially along the sides of the fingers 16.

Portions of the gate material 22, particularly at the interface of the gate material 22 and the drift layer 14, form a silicide as depicted by FIG. 1F. The silicide is formed by heating the semiconductor and the gate material 22 to a temperature of 450° C. As the preferred gate material 22 is platinum, the heat treatment will result in the formation of platinum silicide.

Referring next to FIG. 1G, a conductive ohmic source contact 24 is then provided upon each source well 20. A drain contact 26 is also provided along the substrate 12 of each transistor. The preferred material for the ohmic source contacts 24 is Nickel, however, Ti, Ti—W and Al are materials which may also be used. The preferred material for the ohmic drain contacts 26 is Nickel, however, Ti, Ti—W and Al may be used as well.

A dielectric 28, which is preferably sputtered or LPCVD silicon dioxide, but may either be an oxide or a nitride, is then provided over the entire upper portion of the structure as shown in FIG. 1H. Thus, the gate material 22, the source contacts 24 and the exposed portion of the fingers 16 are all encapsulated by dielectric 28.

Referring next to FIG. 1I, portions of the dielectric material 28 are then removed at the source contacts 24 and gate material 22, exposing the source contacts 24 and gate material 22. The dielectric 28 may be removed by reactive ion etching as discussed above.

Once the dielectric 28 has been removed so as to expose the gate and the source, a photoresist (not shown) is provided over the entire upper portion of the structure. The photoresist is then patterned so as to remove the photo resist from every area in which metal material, which will comprise electrodes for the transistor, is to remain. Photo resist is therefore not applied to the exposed portions of the source contacts 24 and gate material 22.

Referring next to FIG. 1J, electrode metal is then deposited over the entire upper portion of the structure. At this point, the electrode metal 30 (which is understood to be any suitable conductive metal, alloy or compound) such as Ti—Pt—Au or Cr—Pd—Au lies directly upon the exposed portions of the gate material 22 and the source contacts 24 and otherwise lies upon photo resist material.

Electrode metal 30 is then selectively removed, as shown in FIG. 1K, leaving the respective source and gate contacts 32, 34. The unwanted electrode metal 30 is preferably removed by a metal liftoff technique in which acetone is applied to the photoresist, dissolving the photoresist and carrying away the electrode metal 30 which had been applied on the photoresist material.

Variations on the above described process may be made. For example, although reactive ion etching is the preferred means for removing and shaping the drift layer 14, the gate material 22 and the dielectric 28, other methods such as electrolytic etching may be used. Furthermore, although it is preferred to form a silicide by heat treating the gate material 22, the device will function without such silicide formation.

Also, for each of the embodiments of the static induction transistor provided herein, it is preferred to provide ohmic contacts upon the source and drain regions and then placing an electrode into contact with the ohmic contacts. However, it is apparent to those skilled in the art that often, the electrode may contact directly upon the source and/or the drain regions.

Although it is preferred that the drift layer 14 is epitaxially grown upon the substrate 12, the drift layer 14 and substrate 12 may be provided as a single layer in which various ion implantation provides the desired conductivity types. Similarly, although it is preferred that the source wells 20 are grown as separate epitaxial layers on the fingers 16 of the drift layer 14, the source wells 20 may be formed by ion implantation as well.

It is preferred in this embodiment that each finger 16 be approximately 2 μm wide, and that each finger 16 be spaced 2 μm apart so that each recess 18 be 2 μm wide. Further, each finger 16 is preferably around 1 μm in height. The preferred thickness of the etched and heat treated gate material 22 is 0.5 μm. The approximate thickness of the source wells 20 is 0.2 μm. It is understood that various dimensions may be employed and that dimensions will vary for the different transistor structures of the further preferred embodiments. The source and gate electrodes 32, 34 may be made of any conductive metal or alloy such as Ti—Pt—Au or Cr—Pd—Au or aluminum.

Thus, the transistor 10 preferably is structured as follows with reference to FIG. 1K. A silicon carbide substrate 12 is provided. Then, a silicon carbide drift layer 14 is provided upon the substrate 12, wherein the drift layer 14 has two spaced-apart protrusions or fingers 16 which extend away from the substrate 12. Each finger 16 of the drift layer 14 has a source well 20 of silicon carbide provided thereon. A layer of conductive gate material 22 is then provided along the drift layer 14 between the two fingers 16. An ohmic source contact 24 is provided upon each source region 20. An ohmic drain contact 26 is provided along the substrate 12. Conductive source electrodes 32 are provided upon respective source contacts 24. Similarly, a conductive gate contact 34 is provided upon the gate material 22.

The substrate 12 is preferably n+ conductivity type while the drift layer 14 is preferably n– conductivity type and the source regions 20 are preferably n+ conductivity type. However, in an alternative embodiment, the substrate 12 may be p+ conductivity type while the drift layer 14 is p– conductivity type and the source regions 20 are p+ conductivity type. The preferred dopant to be introduced to the silicon carbide for the p type layers is aluminum or boron.

The drift layer 14 and each source region 20 are preferably formed by epitaxial growth, however, either or both of the drift layer 14 and the source regions 20 may alternatively be formed by ion implantation. The gate material 22 is preferably platinum silicide although any suitable material may be used such as platinum, gold, molybdenum and polysilicon.

Referring next to FIG. 2, a second preferred static induction transistor is shown. This second preferred embodiment is a planar Schottky barrier gate design. Similar to the first preferred embodiment, the planar Schottky barrier gate type static induction transistor utilizes a substrate 52 of silicon carbide having a drift layer 54 of silicon carbide provided on the substrate 52. The drift layer 54 is preferably epitaxially grown on the substrate 52. However, drift layer 54 may also be formed by ion implantation into the silicon carbide.

Source wells 60 are provided on the drift layer 54 at some distance from one another. The source wells 60 are preferably formed by ion implantation of the semiconductor, however, the source wells 60 may be epitaxially grown on the drift layer 54.

A layer of gate material 62 is then provided upon the drift layer 54 between two separated source wells 60. The gate material 62 is preferably made of platinum although molybdenum, gold or polysilicon made be used. The gate material 62 is preferably applied by sputtering or evaporation.

The substrate 52 and the source wells 60 are preferably n+ conductivity type, 6H polytype silicon carbide, while the drift layer 54 is preferably n– conductivity type, 6H polytype silicon carbide. Although 6H polytype silicon carbide is preferred, any polytype may be utilized.

A silicide is formed atop at least some portions of the gate material 62, particularly at the interface of the gate material 62 and the drift layer 54. The silicide is formed by heating the semiconductor and the gate material 62 to a temperature of 450° C. As the preferred gate material 62 is platinum, the heat treatment will result in the formation of platinum silicide.

Conductive ohmic source contacts 64 are provided upon each source well 60. Similarly, an ohmic drain contact 66 is provided along the substrate 52. The preferred material for the ohmic source contacts 64 and ohmic drain contacts 66 is Nickel, however, Titanium, Titanium-Tungsten and Aluminum are materials which may also be used.

Conductive source electrodes 65 are electrically connected to the source contacts 64. Similarly, a gate contact 63 is electrically connected to the gate material 62. The source contact 64 and source electrode 65 are electrically isolated from the gate contact 62 and gate contact 63 by a dielectric material (not shown).

Although the silicon carbide utilized in the second preferred static induction transistor is preferably n conductivity type, p conductivity type silicon carbide may also be used. In this alternative, the substrate 52 and source wells 60 would each be p+ conductivity type while the drift layer 54 would be p– conductivity type.

Figure 3:
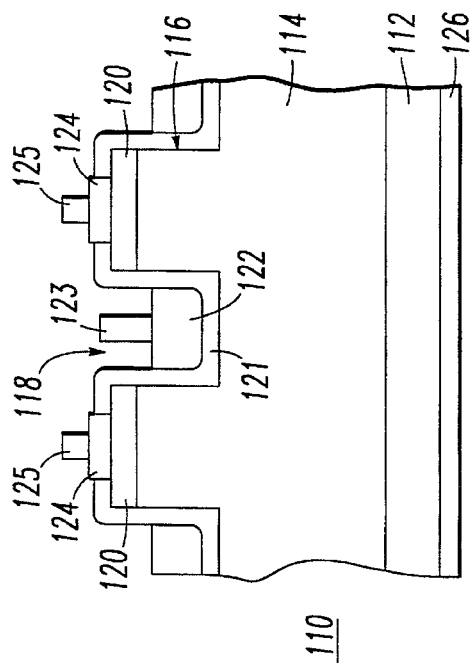
FIG. 3 is a cross-sectional view of a third preferred static induction transistor.

Referring next to FIG. 3, a third preferred silicon carbide static induction transistor is shown. This embodiment utilizes a recessed MOS gate. The recessed MOS gate static induction transistor 110 has a silicon carbide substrate 112. A drift layer 114 is provided upon substrate 112. Drift layer 114 is preferably epitaxially grown upon substrate 112. However, drift layer 114 and substrate 112 may have their conductivity types produced by ion implantation of a single semiconductor layer, forming layers of different conductivity types.

The drift layer 114 is shaped and portions thereof are removed so as to form a number of extending protrusions or fingers 116 which extend outward from substrate 112. The drift layer 114 may be shaped by any convenient means such as by reactive ion etching.

The fingers 116 are spaced apart so that a recess 118 is provided between pairs of fingers 116. Each finger 116 has a source 120 provided on the end thereof distal to substrate 112. The source 120 is preferably epitaxially grown upon each finger 116 of drift layer 114. However, the source 120 may be formed by any convenient means such as by ion implantation. Substrate 112 is preferably n+conductivity type, the drift layer 114 is preferably n–conductivity type and the sources are preferably n+conductive type. In the alternative, substrate 112 may be p+ conductivity type, the drift layer 114 p– conductivity type and the sources p+ conductivity type.

A layer 121 of either an oxide or an oxide-nitride-oxide is then provided on the drift layer 114 within recess 118. Layer 121 of oxide and/or nitride accomplishes isolation of gate conducting material 122 from the SiC drift region. Layer 121 extends partially upward along finger 116, so as to form a U-shaped coating as can be seen in FIG. 3. A region 122 of conductive gate material, such as polysilicon, is then provided within U-shaped oxide layer 121.

Ohmic source contacts 124 are provided upon each source well 120. Similarly, an ohmic drain contact 126 is provided along substrate 112. The ohmic contacts are preferably made of nickel. Conductive source electrodes 125 are electrically connected to the source contacts 124 and gate electrodes 123 are connected to the gate material 122. The source contacts 124 and the source electrodes 125 are electrically isolated from the gate material 122 and gate electrode 123 by providing a dielectric material (not shown) around them.

Figure 4:
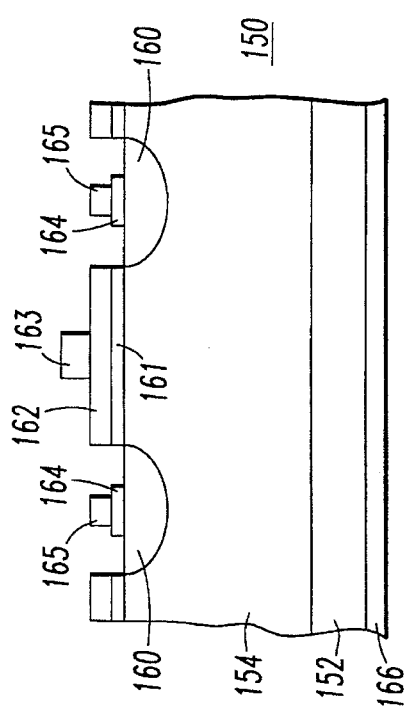
FIG. 4 is a cross-sectional view of a fourth preferred static induction transistor.

Referring next to FIG. 4, a fourth preferred silicon carbide static induction transistor 150 is shown which utilizes a planar MOS gate. Transistor 150 has a substrate 152, preferably formed, of n+ conductivity type silicon carbide. A drift layer 154, preferably formed, of n− conductivity type silicon carbide is provided upon substrate 152. Drift layer 154 is preferably formed by epitaxial growth upon substrate 152. However, drift layer 154 and substrate 152 may initially be formed as one single layer of silicon carbide in which different layers of conductivity types are formed by ion implantation.

Source wells 160 are then provided upon the drift layer 154. The source wells 160 are preferably of n+conductivity type. Source wells 160 are preferably formed by ion implantation, however, they may be epitaxially grown upon drift layer 154.

A layer 161 of either an oxide or an oxide-nitride-oxide is then provided atop the drift layer 154 between two source wells 160. A layer 161 accomplishes isolation of gate material 162 from the SIT drift layer 154. A layer of gate material 162 is then provided upon oxide layer 161. The gate material 162 is preferably polysilicon.

Ohmic source contacts 164, preferably fabricated of nickel, are then placed respectively upon each source well 160. Similarly, ohmic drain contact 166 is provided upon substrate 152. Conductive source electrodes 165 may be connected to ohmic source contacts 164. Then, a gate electrode 163 may be connected to gate material 162. Each source contact 164 and source electrode 165 are preferably electrically isolated from the gate material 162 and gate electrode 163 by depositing a dielectric material (not shown) upon the structure around the source contacts 164 and the exposed gate material.

Although n type silicon carbide is preferred, p type silicon carbide may also be used. Thus, substrate 152 and source wells 160 may instead be formed of p+silicon carbide, while drift layer 154 may be formed of p−silicon carbide.

Figure 5:
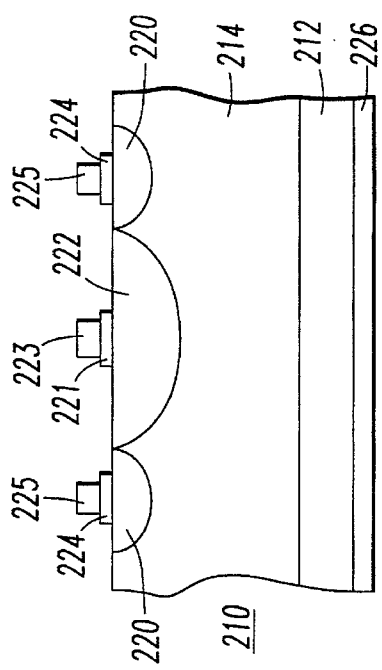
FIG. 5 a cross-sectional view of a fifth preferred static induction transistor.

Referring next to FIG. 5, a fifth preferred silicon carbide static induction transistor 210 is shown. This transistor utilizes a planar PN junction gate. The structure is comprised of a substrate 212, formed of n+silicon carbide. An n− silicon carbide drift layer 214 is provided upon the substrate 212. As noted above, drift layer 214 may be provided upon substrate 212 by either epitaxial growth, or may be formed by ion implantation of the semiconductor. Source wells 220 are provided along drift layer 214 and are spaced apart at some selected distance from one another.

The source wells 220 are preferably comprised of n+ conductivity type silicon carbide. The source wells 220 are preferably formed by ion implantation of the drift layer 214, however, they may alternatively be epitaxially grown upon drift layer 214.

A gate well 222 is provided upon the drift layer 214 between two source wells 220. The gate well 222 is preferably comprised of p+ conductivity type. The gate wells 222 are preferably formed by ion implantation of the drift layer 214. However, the gate wells 222 may also be epitaxially grown upon drift layer 214.

Ohmic source contacts 224, preferably fabricated of nickel, are placed respectively upon each source well 220. An ohmic gate contact 221 is provided on each gate well 222. Similarly, an ohmic drain contact 226 is provided upon substrate 212. Conductive source electrodes 225 are connected to ohmic source contacts 224. Similarly, gate electrodes 223 are connected to gate contacts 221. Each source contact 224 and source electrode 225 are preferably electrically isolated from the gate contact 221 and gate electrode 223 by depositing a dielectric material (not shown) upon the structure around the source contacts 224 and gate contact 221.

Although a device having an n type silicon carbide substrate is preferred, p type silicon carbide may also be used. In this alternative, substrate 212 and source wells 220 may instead be formed of p+ silicon carbide, while drift layer 214 may be formed of p− silicon carbide, and gate well 222 may be formed of n+ silicon carbide.

While certain present preferred embodiments have been shown and described, it is distinctly understood that the invention is not limited thereto but may be otherwise embodied within the scope of the following claims.

We claim:

1. A static induction transistor comprising a substrate layer and a drift layer on the substrate layer wherein:

the transistor is a recessed Schottky barrier gate type;

the substrate layer is fabricated of a heavily-doped silicon carbide having a selected conductivity type;

the drift layer is fabricated of a lightly-doped silicon carbide having the selected conductivity type provided upon the substrate layer, the drift layer having a plurality or spaced apart protrusions which extend outward from the drift layer, and wherein the static induction transistor further comprises a plurality of source regions constructed of heavily-doped silicon carbide having the selected conductivity type, each source region being disposed upon a respective one of the protrusions of the drift layer;

a gate material provided along the drift layer between two adjacent ones of the protrusions;

a gate contact provided upon the gate material;

a drain contact provided along the substrate layer; and source contacts provided along respective ones of the source regions.

2. The static induction transistor of claim 1 wherein the drift layer and source regions are formed as discrete epitaxial layers.

3. The static induction transistor of claim 1 wherein the drift layer and source regions are formed by ion implantation.

4. The static induction transistor of claim 1 wherein the substrate layer is made of n+ type silicon carbide, the drift layer is made of n− type silicon carbide, and the source regions are made of n+ type silicon carbide.

5. The static induction transistor of claim 1 wherein the substrate layer is made of p+ type silicon carbide, the drift layer is made of p− type silicon carbide, and the source regions are made of p+ type silicon carbide.

6. The static induction transistor of claim 1 wherein the gate material is one of platinum, platinum silicide, gold, molybdenum and polysilicon.

7. A static induction transistor comprising a substrate layer and a drift layer on the substrate layer wherein:

the transistor is a planar Schottky barrier gate type;

the substrate layer is a heavily-doped silicon carbide having a selected conductivity type;

the drift layer is a lightly-doped silicon carbide having the selected conductivity type provided upon the substrate layer; and wherein the static induction transistor further comprises spaced apart source wells of the selected conductivity type provided along the drift layer;

a layer of gate material provided upon the drift layer between two of the source wells;

a drain contact provided along the substrate layer;

source contacts provided upon respective ones of the source wells; and a gate contact provided upon the layer of gate material.

8. The static induction transistor of claim 7 wherein the gate material is one of platinum, platinum silicide, gold and molybdenum.

* * * * *